(12) United States Patent
Morita et al.

(10) Patent No.: US 8,525,537 B2
(45) Date of Patent: Sep. 3, 2013

(54) METHOD AND APPARATUS FOR PROBE CONTACTING

(75) Inventors: Kazuhiro Morita, Kasama (JP); Kaoru Umemura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 383 days.

(21) Appl. No.: 13/058,861

(22) PCT Filed: Jul. 23, 2009

(86) PCT No.: PCT/JP2009/063159
§ 371 (c)(1),
(2), (4) Date: Feb. 12, 2011

(87) PCT Pub. No.: WO2010/018739
PCT Pub. Date: Feb. 18, 2010

(65) Prior Publication Data
US 2011/0133765 A1 Jun. 9, 2011

(30) Foreign Application Priority Data
Aug. 14, 2008 (JP) ................................ 2008-208827

(51) Int. Cl.
*G01R 31/20* (2006.01)
(52) U.S. Cl.
USPC .............. 324/754.1; 324/750.16; 324/754.11; 324/754.01; 250/309; 250/310
(58) Field of Classification Search
USPC ................ 324/754.01, 754.03, 754.1–754.2, 324/754.22
See application file for complete search history.

(56) References Cited

U.S. PATENT DOCUMENTS

| 6,452,174 | B1 | 9/2002 | Hirose et al. | |
|---|---|---|---|---|
| 7,477,064 | B2 * | 1/2009 | Kurihara et al. | 324/750.16 |
| 7,511,269 | B2 * | 3/2009 | Munekane | 250/307 |
| 2003/0184332 | A1 * | 10/2003 | Tomimatsu et al. | 324/756 |
| 2005/0269511 | A1 | 12/2005 | Tomimatsu et al. | |
| 2006/0043287 | A1 | 3/2006 | Munekane | |
| 2006/0045326 | A1 | 3/2006 | Toyoda et al. | |
| 2010/0142830 | A1 * | 6/2010 | Yahata | 382/209 |

FOREIGN PATENT DOCUMENTS

| JP | 2001-235321 A | 8/2001 |
|---|---|---|
| JP | 2002-40107 A | 2/2002 |
| JP | 2003-157787 A2 | 5/2003 |
| JP | 2005-167146 A | 6/2005 |
| JP | 2006-066478 A | 3/2006 |
| JP | 2006-093102 A | 4/2006 |
| JP | 2007-189113 A | 7/2007 |

\* cited by examiner

*Primary Examiner* — Huy Q Phan
*Assistant Examiner* — Dustin Dickinson
(74) *Attorney, Agent, or Firm* — Miles & Stockbridge P.C.

(57) ABSTRACT

There is provided a method and a device for accurately detecting the contact of a mechanical probe with a contact object. The contact detecting device comprises a mechanical probe movable for being in contact with a contacted object, a charged particle beam source which generates a charged particle beam applied to the contacted object, a detector for detecting secondary particles or reflected particles from the contacted object, a calculating device which calculates, from a detection signal from the detector, a feature quantity of a shadow of the mechanical probe projected on the contacted object, and a control device which controls the operation of the mechanical probe. The calculating device calculates, as the feature quantity of the shadow of the mechanical probe, a shadow depth $S(x, y)$, and obtains an evaluation value $J(z)$, showing a distance between the contacted object and the mechanical probe, based on the shadow depth $S(x, y)$.

20 Claims, 8 Drawing Sheets

HIGH ⟶ LOW

POSITION OF PROBE 3 WITH RESPECT TO SAMPLE 5

LARGE ⟵ DISTANCE Z BETWEEN SAMPLE AND PROBE ⟶ SMALL

METHOD AND APPARATUS FOR PROBE CONTACTING

TECHNICAL FIELD

This invention relates to a processing apparatus and an inspection apparatus for a semiconductor device.

BACKGROUND ART

Recently, with miniaturization and higher functionality of a semiconductor device, a cross section structure of the semiconductor device is required to be observed and inspected in addition to inspection of the surface pattern of the semiconductor device. In the inspection of the structure of the semiconductor device, a minute sample piece is cut out from the semiconductor device to be observed by an electron microscope. In order to cut out the minute sample piece from the semiconductor device, a charged particle beam system including a mechanical probe and a deposition gun or a focused ion beam system is used.

In the above processing apparatus, when the minute sample piece is cut out, the mechanical probe should be in contact with the surface of the sample. Accordingly, the processing apparatus is provided with a device for detecting the contact of the mechanical probe. The contact of the mechanical probe is detected by the contact detecting device, whereby the mechanical probe is prevented from being damaged.

Patent Document 1 discloses a technique of detecting the contact of the mechanical probe by measuring a current flowing from a sample to be processed toward the mechanical probe.

However, in some semiconductor devices, the surface of the sample to be processed is protected by an insulating film. In this case, a current does not flow between the mechanical probe and the sample to be processed. Thus, the electrical method described in the Patent Document 1 cannot be used in this case.

Patent Document 2 describes a method of moving the mechanical probe while measuring the distance between the sample to be processed and the mechanical probe by images from different directions. However, in this method, there is a problem that the device is complicated. Further, in this method, the mechanical probe is required to be moved in the same direction until the front end of the mechanical probe and the front end of the shadow coincide with each other. Thus, there is a defect that it is not available until the distance between the mechanical probe and the sample to be processed becomes several μm. In addition, it is necessary to precisely obtain the incidence angle of a focused ion beam and the mounting angle of the mechanical probe.

Patent Document 3 describes a technique of detecting the contact using that a probe image is changed by application of an AC voltage to the mechanical probe or that the image is changed between before and after contact due to mechanical vibration of the mechanical probe. In this method, since an AC voltage source is required to be provided, there is a problem that the device is complicated and increased in size.

Patent Document 4 describes a method of accurately obtaining the distance between the sample to be processed and the mechanical probe by images obtained from two or more microscopes. In this method, since the two or more microscopes are required to be provided, there is a problem that the device is increased in size.

Patent Document 5 describes a method of bringing the mechanical probe into contact safely by reducing the drive speed of the mechanical probe, and using a shadow near the mechanical probe. This method simply utilizes the reduction in brightness around the mechanical probe, and there is a problem that the reliability of the detection of the contact is low.

Patent Document 6 describes a method of driving the mechanical probe until the front end of the mechanical probe and the shadow generated from the mechanical probe coincide with each other. However, the brightness of an image is reduced depending on a state of a sample to be processed, such as when an observation object is an insulating material. In such a case, contrast is required to be increased by applying a voltage to the mechanical probe. Accordingly, there is a problem that the device configuration is complicated.

As described above, in the method of detecting the contact of the mechanical probe with the use of the image of the mechanical probe, in general, there is a common problem that the reliability is significantly reduced depending on the case where the brightness of an obtained image is low and the pattern formed on the sample surface.

Patent Document 5 describes a method capable of dealing with the case where the brightness is low by obtaining a change from an image obtained in the last step. However, when the change between an image with low brightness and the image in the last step is calculated, noise is emphasized, whereby there is a problem that the detection reliability is reduced.

Patent Document 1: Japanese Patent Laid-Open Publication No. 2001-235321

Patent Document 2: Japanese Patent Laid-Open Publication No. 2006-93102

Patent Document 3: Japanese Patent Laid-Open Publication No. 2007-189113

Patent Document 4: Japanese Patent Laid-Open Publication No. 2005-167146

Patent Document 5: Japanese Patent Laid-Open Publication No. 2002-40107

Patent Document 6: Japanese Patent Laid-Open Publication No. 2006-93102

DISCLOSURE OF THE INVENTION

Problems to be Solved by the Invention

As described above, in the related art contact detecting method using the image of the mechanical probe, it is difficult to perform the contact detection accurately for the image with low brightness. For example, when a minute sample piece is cut out from a semiconductor device, the cut-out minute sample piece is mounted on a conveying holder. At that time, it is necessary to detect that a mechanical probe is in contact with the conveying holder.

In the related art method, it is difficult to accurately detect that the mechanical probe is in contact with the conveying holder.

This invention provides a method and device for accurately detecting a contact between a mechanical probe and an object to be contacted.

Means for Solving the Problem

According to this invention, a contact detecting device has a mechanical probe movable for being in contact with an object to be contacted, a charged particle beam source which generates a charged particle beam applied to the object to be contacted, a detector for detecting secondary particles and backscattered particles from the object to be contacted, a calculating device which calculates, from a detection signal from the detector, a feature quantity of a shadow of the mechanical probe projected on the object to be contacted, and a control device which controls the operation of the mechanical probe.

The calculating device calculates a shadow density $S(x, y)$ as the feature quantity of the shadow of the mechanical probe and obtains an evaluation value $J(z)$, representing a distance between the object to be contacted and the mechanical probe, based on the shadow density $S(x, y)$.

Effect of the Invention

According to this invention, there can be provided a method and device for accurately detecting a contact between a mechanical probe and an object to be contacted.

EXPLANATION OF SYMBOLS

Figure 1:
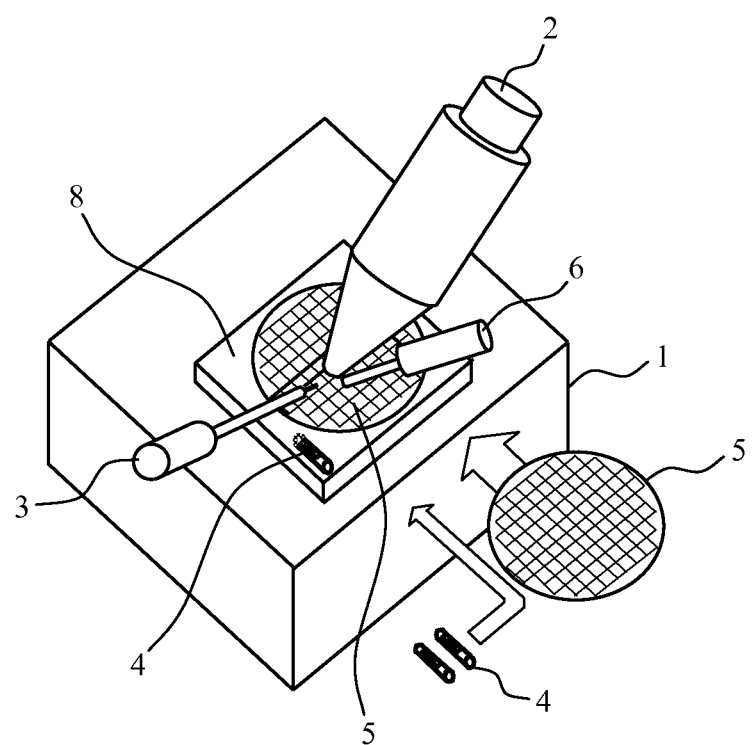
FIG. 1 is a view for explaining an outline of a focused ion beam system according to this invention.

1 Sample chamber
2 Focused ion beam source
3 Mechanical probe
4 Conveying holder
5 Sample (sample to be processed)
6 Gas assisted gun
7 Insulating film
8 Sample table
9 Ammeter
10 Power source
11 Secondary particle
12 Secondary particle detector
13 Image display unit
14, 15 Image memory
16 Switch
17, 18 Calculator
19 Controller
20 Focused ion beam

BEST MODE FOR CARRYING OUT THE INVENTION

The outline of a focused ion beam system or a charged particle beam system according to this invention will be described with reference to FIG. 1. The focused ion beam system of this example has a focused ion beam source 2 generating a focused ion beam, a sample table 8 supporting a sample 5, a mechanical probe 3 used in the operation of cutting out a minute sample piece from the sample 5, a conveying holder 4 holding the minute sample piece cut out from the sample 5, and a gas assisted gun (a deposition gun or a deposition/etching gun) 6 used in a deposition operation. Those components are provided in a sample chamber 1.

An outline of the processing of cutting out the minute sample piece from the sample 5 by the focused ion beam system of this example will be described. First, the sample 5 and the conveying holder 4 are arranged on the sample table 8. In this example, although the sample 5 is described as a semiconductor wafer, the sample 5 may be any object. Next, the minute sample piece is cut out from the sample 5 by the focused ion beam from the focused ion beam source 2. At that time, the periphery of the minute sample piece is trimmed but the minute sample piece is not completely cut out. The front end of the mechanical probe 3 is adhered to the minute sample piece by the gas assisted gun 6. At that time, the minute sample piece is separated from the sample 5 by the focused ion beam. Namely, the minute sample piece is separated from the sample 5 while the minute sample piece is adhered to the front end of the mechanical probe 3. The mechanical probe 3 is moved to the conveying holder 4. The minute sample piece adhered to the front end of the mechanical probe 3 is moved with the mechanical probe 3. The minute sample piece is separated from the mechanical probe 3 by the focused ion beam. The minute sample piece is held on the conveying holder 4. The conveying holder 4 holding the minute sample piece thereon is conveyed outside the sample chamber 1 to be observed by an electron microscope.

In the processing of cutting out the minute sample piece from the sample with the use of the focused ion beam system, the mechanical probe 3 is brought into contact with the sample 5. However, if the front end of the mechanical probe 3 is pressed against the surface of the sample 5 by a strong force, the mechanical probe 3 is damaged. Thus, it is necessary to detect accurately that the front end of the mechanical probe 3 is in contact with the sample 5.

In order to improve the productivity in the focused ion beam system, the above processing procedure is required to be automated. The automation of the processing procedure is required in view of the improvement of the productivity in the semiconductor processing process. To automate the operation of the mechanical probe 3 is important for automation of the focused ion beam system. Here, the problems are that the contact between the mechanical probe 3 and the sample 5 is accurately detected, and the contact between the mechanical probe 3 and the conveying holder 4 is accurately detected. The accurate detection is strongly required in view of protection of the sample 5 and the mechanical probe 3 and safety of devices. Hereinafter, although the sample 5 and the conveying holder 4 are each referred to as an object to be contacted, the object to be contacted is a target to be in contact with the mechanical probe 3 and is not limited to the sample 5 and the conveying holder 4.

Figure 2A:
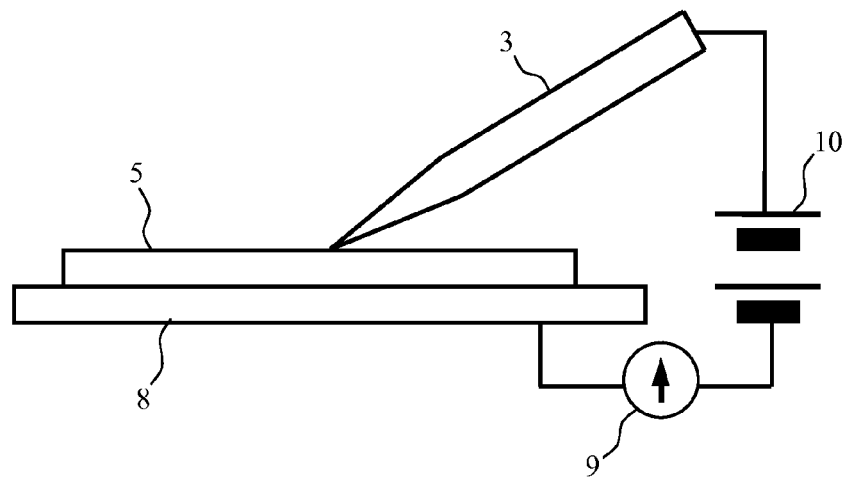
FIG. 2A and FIG. 2B are views for explaining examples of the related art contact detecting method for a mechanical probe.

The related art contact detecting method for a mechanical probe will be described with reference to FIG. 2A. As illustrated, the sample 5 is disposed on the sample table 8. A voltage from a power source 10 is applied to between the mechanical probe 3 and the sample table 8. An ammeter 9 is connected between the sample table 8 and the power source 10. When the mechanical probe 3 is in contact with the sample 5, they are in an electrically conductive state, and a current is flowed. The current is measured by the ammeter 9, whereby the contact between the sample 5 to be processed and the mechanical probe 3 can be detected.

Figure 2B:
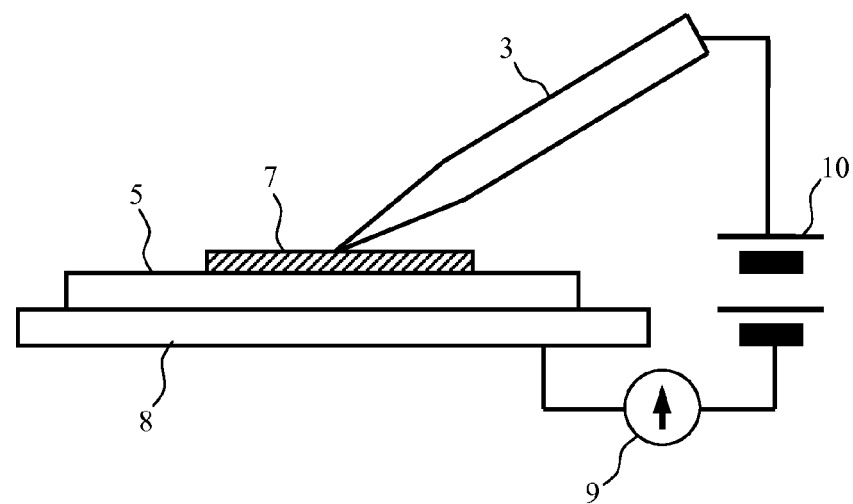

The related art contact detecting method for a mechanical probe will be described with reference to FIG. 2B. In some semiconductor devices, the surface is protected by an insulating film. In this example, an insulating film 7 is formed on the surface of the sample 5 as illustrated. In this case, the contact of the mechanical probe cannot be detected by the electrical method shown in FIG. 2A.

An example of the contact detecting device for a mechanical probe, according to this invention will be described with reference to FIG. 3. According to this invention, the contact detecting device for a mechanical probe has the focused ion beam source 2, the mechanical probe 3, a secondary particle detector 12, a switch 16, first and second image memories 14 and 15, first and second calculators 17 and 18, a controller 19, and an image display unit 13.

A focused ion beam 20 irradiated from the focused ion beam source 2 is applied to the sample 5. The sample 5 emits secondary particles 11. The secondary particles 11 are caught by the secondary particle detector 12. A detection signal from the secondary particle detector 12 passes through the switch 16 to be stored in any one of the two image memories 14 and 15. Image data stored in the image memories 14 and 15 are sequentially read by the first calculator 17 to be displayed by the image display unit 13. The operation of cutting out the minute sample piece from the sample can be observed through the image display unit 13.

The first calculator 17 calculates a feature quantity of a shadow, using the image data stored in the image memories 14 and 15. According to this invention, a shadow density S(x, y) is calculated as the feature quantity of the shadow. The shadow density is sent to the second calculator 18. The second calculator 18 calculates a function representing a distance between the sample 5 to be processed and the mechanical probe 3 from the shadow density. According to this invention, an evaluation value J(z) is calculated as the function representing the distance between the sample 5 to be processed and the mechanical probe 3.

The evaluation value J(z) is sent to the controller 19. The controller 19 moves or stops the mechanical probe 3 based on the evaluation value J(z). The shadow density S(x, y) and the evaluation value J(z) will be described in detail later. The controller 19 can freely drive the mechanical probe 3 regardless of the calculation results of the second calculator 18.

Figure 3:
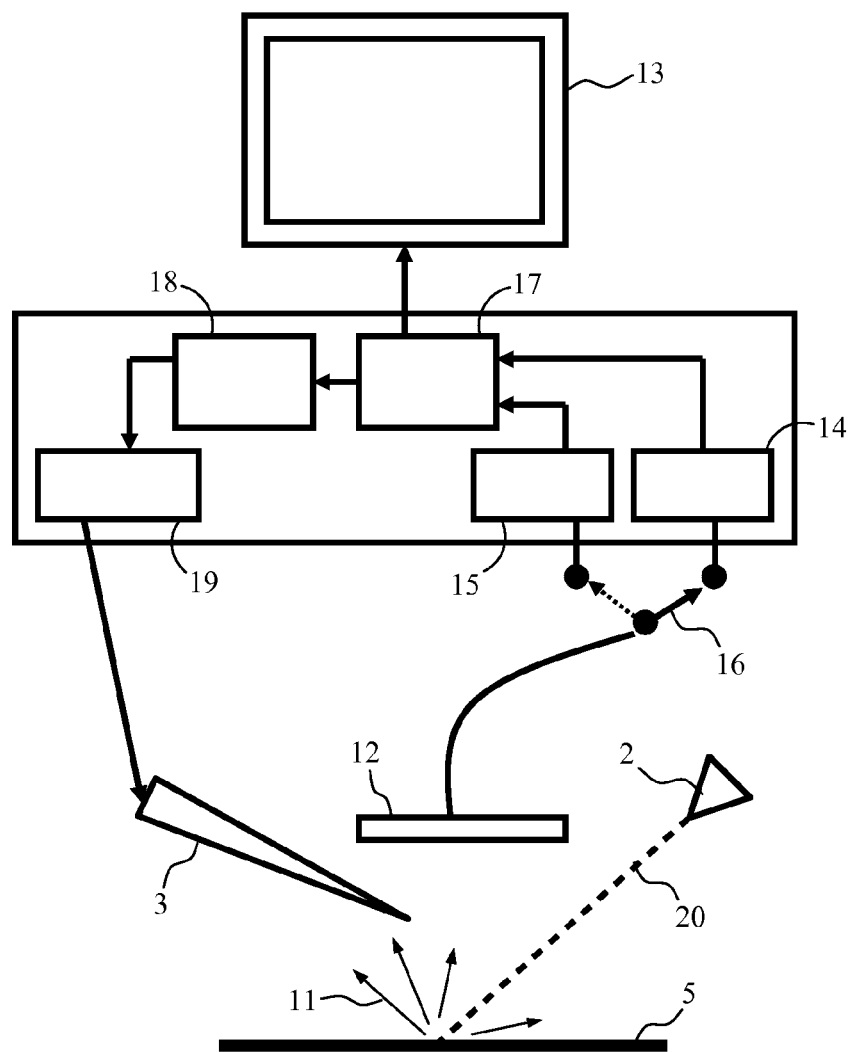
FIG. 3 is a view for explaining an example of a contact detecting device for the mechanical probe, according to this invention.

In the example of FIG. 3, although the two image memories 14 and 15 are provided, one image memory may be divided into two to be used. Further, although the two calculators 17 and 18 are provided in this example, a single calculator may be used. Furthermore, in this example, the first calculator 17 has an image display function. Thus, the image data stored in the image memories 14 and 15 is sent to the image display unit 13 through the first calculator 17. However, the second calculator 18 may have the image display function. In such a case, the image data stored in the image memories 14 and 15 is sent to the image display unit 13 through the second calculator 18. The same holds for the case where a single calculator is used instead of the two calculators 17 and 18. In this example, although the secondary particles 11 are detected, backscattered particles may be detected instead of the secondary particles.

In the example of FIG. 3, the focused ion beam 20 from the focused ion beam source 2 is used. However, a charged particle beam other than focused electron beam and focused ion beam such as a projection ion beam or a projection electron beam may be used. Although a single focused ion beam source 2 may be used, a plurality of focused ion beam sources 2 or a plurality of charged particle beam lens barrels may be used. As means of observing the mechanical probe 3 and the sample 5 to be processed, an optical microscope may be used.

The shadow due to the mechanical probe 3 will be described with reference to FIG. 3. When the focused ion beam 20 from the focused ion beam source 2 is applied to the sample 5 to be processed, the secondary particles 11 are emitted by impact of the ion beam. The secondary particles 11 are caught by the secondary particle detector 12 to be visualized. When the distance between the mechanical probe 3 and the sample 5 to be processed is relatively large, many of the secondary particles 11 reach the secondary particle detector 12 to be caught thereby. Accordingly, an image of a sample is less affected by the mechanical probe 3. However, when the distance between the mechanical probe 3 and the sample 5 to be processed is relatively small, many of the secondary particles 11 are blocked by the mechanical probe 3 and do not reach the secondary particle detector 12. Thus, when the signal of the secondary particle detector 12 is visualized, the shadow of the mechanical probe 3 appears. The smaller the distance between the mechanical probe 3 and the sample 5 to be processed, the thicker the shadow of the mechanical probe 3, so that it becomes hard to see the image of the sample.

Figure 4:
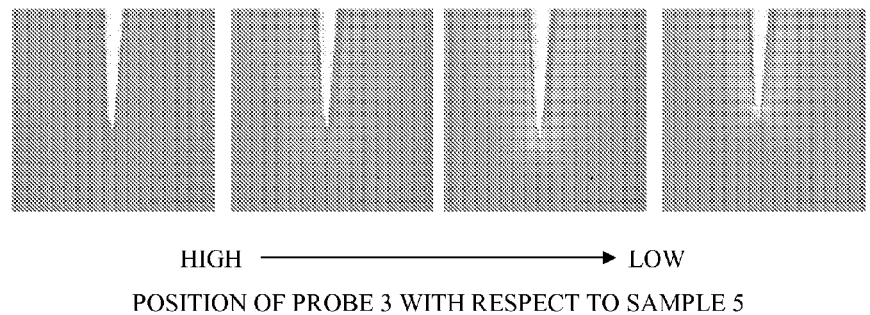
FIG. 4 is a view showing that a shadow of the mechanical probe is changed by change of a distance between the mechanical probe and a sample to be processed.

FIG. 4 shows that the shadow of the mechanical probe is changed due to change of the distance between the mechanical probe 3 and the sample 5 to be processed. An image at the left end of FIG. 4 shows the case where the distance between the mechanical probe 3 and the sample 5 to be processed is relatively large, and an image at the right end of FIG. 4 shows the case where the distance between the mechanical probe 3 and the sample 5 to be processed is relatively small. As shown in the images of FIG. 4, a change of the shadow of the mechanical probe 3 is detected, whereby the distance between the mechanical probe 3 and the sample 5 to be processed can be indirectly known. Although described in detail hereinafter, according to this invention, the change of the shadow of the mechanical probe 3 is quantitatively calculated, whereby the distance between the mechanical probe 3 and the sample 5 to be processed is detected, that is, it is detected that the mechanical probe 3 is in contact with the sample 5 to be processed. Hereinafter, although the case where the mechanical probe 3 is in contact with the sample 5 to be processed will be described, as shown in FIG. 1, the same holds for the case where the mechanical probe 3 is in contact with the conveying holder 4.

First, a shadow density S(x, y) as a feature quantity of the shadow will be described. According to this invention, a "shadow density" S(x, y) as a feature quantity of the shadow is introduced, in order to quantitatively express such a feature that the shadow generated by the mechanical probe 3 is thin or thick. The "shadow density" S(x, y) is a quantity showing the level of brightness reduced by the existence of the mechanical probe 3 relative to the case where the mechanical probe 3 is not provided. The shadow density is obtained by the following formula (1).

$$S(x, y) = \frac{I_0(x, y) - I_z(x, y)}{I_0(x, y)} \quad (1)$$

wherein $S(x, y)$ represents the shadow density at a pixel position $(x, y)$, $I_0(x, y)$ represents the brightness at the pixel position $(x, y)$ of an observed image when the mechanical probe 3 is not provided, and $I_z(x, y)$ represents the brightness at the pixel position $(x, y)$ of the observed image when the mechanical probe 3 is provided. Hereinafter, $I_0(x, y)$ is referred to as brightness of a reference image or merely referred to as a reference image. $I_z(x, y)$ is referred to as brightness of a probe image or merely referred to as a probe image. The smaller the distance between the mechanical probe 3 and the sample 5 to be processed, the larger the reduced level of the brightness of an image, and the shadow density $S(x, y)$ obtained by the formula (1) exhibits a large value. The shadow density may be obtained by the following formula (2) instead of the formula (1):

$$S(x, y) = \frac{\alpha \times I_0(x, y) - \beta \times I_z(x, y)}{\alpha \times I_0(x, y)}. \quad (2)$$

In the formula (2), the reference image brightness $I_0(x, y)$ and the probe image brightness $I_z(x, y)$ are multiplied respectively by the coefficients $\alpha$ and $\beta$. According to this constitution, the shadow density according to the mechanical probe 3 can be more effectively obtained. The shadow density may be obtained by the following formulae (3) and (4) instead of the formula (1):

$$S(X, Y) = \frac{I_0(X, Y) - I_z(X, Y)}{I_0(X, Y)}. \quad (3)$$

$$\begin{pmatrix} X \\ Y \end{pmatrix} = \begin{pmatrix} a_{11} & a_{12} & a_{13} \\ a_{21} & a_{22} & a_{23} \end{pmatrix} \begin{pmatrix} x \\ y \\ 1 \end{pmatrix}. \quad (4)$$

Although the formula (3) is the same as the formula (1), a position $(X, Y)$ obtained by affine transformation of the pixel position $(x, y)$ is used instead of the pixel position $(x, y)$. The formula (4) shows the affine transformation applied to the pixel position $(x, y)$. The affine transformation is applied to the pixel position $(x, y)$, whereby the influences on inclination of beams can be removed. The shadow density may be obtained by the following formulae (5) and (6) instead of the formula (1):

$$S(x, y) = \frac{I_{0c}(x, y) - I_{zc}(x, y)}{I_{0c}(x, y)} \quad (5)$$

$$I_{0c}(x, y) = \sum_{l=-q}^{q} \sum_{k=-p}^{p} h(k, l) I_0(x, y) \quad (6)$$

$$I_{zc}(x, y) = \sum_{l=-q}^{q} \sum_{k=-p}^{p} g(k, l) I_z(x, y).$$

Although the formula (5) is the same as the formula (1), brightness $I_{0c}(x, y)$ and brightness $I_{zc}(x, y)$ are used instead of the reference image brightness $I_0(x, y)$ and the probe image brightness $I_z(x, y)$. The brightness $I_{0c}(x, y)$ and the brightness $I_{zc}(x, y)$ are obtained by image conversion of the brightness $I_0(x, y)$ and the brightness $I_z(x, y)$ using convolution calculation. The formula (6) shows the convolution conversion applied to the brightness $I_0(x, y)$ and the brightness $I_z(x, y)$. $h(k, l)$ and $g(k, l)$ are convolution coefficients that consist of $(2p + 1) \times (2q + 1)$ pieces. $h(k, l)$ and $g(k, l)$ may be the same coefficients. The convolution conversion is applied to the brightness $I_0(x, y)$ and the brightness $I_z(x, y)$, whereby the contrast of the brightness can be effectively increased. The shadow density may be obtained by the following formula (7) instead of the formula (1):

$$S_c(x, y) = \sum_{l=-q}^{q} \sum_{k=-p}^{p} h(k, l) S(x, y). \quad (7)$$

In the formula (7), the shadow density $S(x, y)$ of the formula (1) is subjected to the convolution conversion. The shadow density may be obtained by the following formulae (8) and (9) instead of the formula (1):

$$S(x, y) = I_0(x, y) - I_z(x, y) \quad (8)$$

$$S(x, y) = \alpha \times I_0(x, y) - \beta \times I_z(x, y) \quad (9).$$

The shadow density $S(x, y)$ represented by the formula (1) represents a relative value of the change amount of the probe image brightness $I_z(x, y)$ with respect to the reference image brightness $I_0(x, y)$. The shadow density $S(x, y)$ represented by the formula (8) represents an absolute value of the change amount of the probe image brightness $I_z(x, y)$ with respect to the reference image brightness $I_0(x, y)$. In the formula (9), the reference image brightness $I_0(x, y)$ and the probe image brightness $I_z(x, y)$ are multiplied respectively by the coefficients $\alpha$ and $\beta$. According to this constitution, the shadow density according to the mechanical probe 3 can be more effectively obtained.

Next, the evaluation value $J(z)$ will be described. According to this invention, the evaluation value $J(z)$ is used as a parameter representing the distance between the sample 5 to be processed and the mechanical probe 3. The evaluation value $J(z)$ is obtained by the following formula (10):

$$J(z) = \sum_{x=1}^{n} \sum_{y=1}^{m} f(x, y) S(x, y). \quad (10)$$

$$f(x, y) = \frac{1}{2\pi \sigma_x \sigma_y \sqrt{1 - \rho_{xy}^2}} e^{\frac{-1}{2\sqrt{1-\rho_{xy}^2}} \left\{ \left(\frac{x-\mu_x}{\sigma_x}\right)^2 + \left(\frac{y-\mu_y}{\sigma_y}\right)^2 - 2\rho_{xy}\left(\frac{x-\mu_x}{\sigma_x}\right)\left(\frac{y-\mu_y}{\sigma_y}\right) \right\}} \quad (11)$$

The evaluation value $J(z)$ is obtained by multiplying the shadow density $S(x, y)$ at the pixel position $(x, y)$ by a Gaussian filter function $f(x, y)$ and integrating in the x and y directions. The formula (11) represents the Gaussian filter function. In the formula (11), $\sigma_x^2$ and $\sigma_y^2$ a represent dispersion in the x and y directions of the shadow density, respectively, $\mu_x$ and $\mu_y$ represent an average value of the shadow density in the x and y directions, respectively, and $\rho_{xy}$ represents a correlation function between x and y. The evaluation value $J(z)$ may be obtained by the following formula (12) instead of the formula (10). In the formula (12), the shadow density $S(x, y)$ is simply integrated in the x and y directions.

$$J(z) = \sum_{x=1}^{n} \sum_{y=1}^{m} S(x, y). \quad (12)$$

Figure 5:
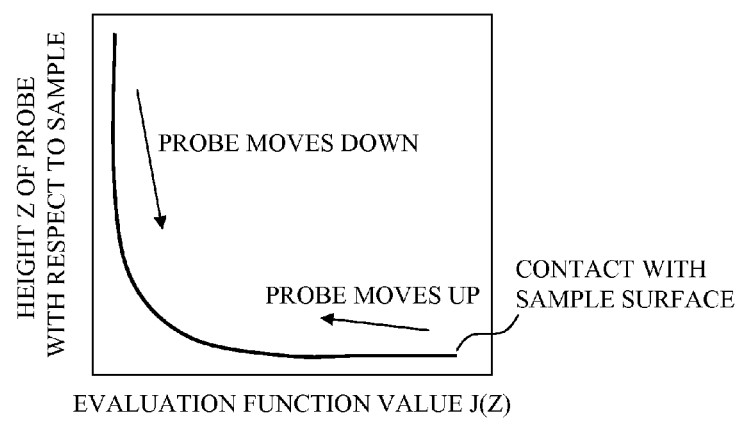
FIG. 5 is a view for explaining a relationship between the distance between the mechanical probe and the sample to be processed and an evaluation value $J(z)$.

The relationship between the distance between the mechanical probe 3 and the sample 5 to be processed and the evaluation value J(z) will be described with reference to FIG. 5. The horizontal axis of FIG. 5 represents the evaluation value J(z), and the vertical axis represents the distance between the mechanical probe 3 and the sample 5 to be processed, that is, the height of the mechanical probe 3 relative to the sample 5 to be processed. As illustrated, when the mechanical probe 3 is moved down to approach the sample 5 to be processed, the evaluation value J(z) is increased. When the mechanical probe 3 is in contact with the sample 5 to be processed, the evaluation value J(z) is the maximum value and is not further increased. When the mechanical probe 3 is further moved down, the evaluation value J(z) is reduced. When the mechanical probe 3 is moved up away from the sample to be processed, the evaluation value J(z) is reduced.

According to this invention, it is detected that the evaluation value J(z) is the maximum value or the evaluation value J(z) is reduced, whereby it is determined that the mechanical probe 3 is in contact with the sample 5 to be processed.

Here, it is assumed that a case where the mechanical probe 3 is repeatedly moved down by predetermined strokes. Each time the mechanical probe 3 is moved down, the evaluation value J(z) is calculated to be compared with the previous evaluation value J(z). When the mechanical probe 3 is moved down, the evaluation value J(z) is increased in comparison with the previous evaluation value J(z). The increasing amount of the evaluation value J(z) is changed by the position of the mechanical probe 3. When the distance between the mechanical probe 3 and the sample 5 to be processed is relatively large, the increasing amount of the evaluation value J(z) is relatively small. Meanwhile, when the distance between the mechanical probe 3 and the sample 5 to be processed is relatively small, the increasing amount of the evaluation value J(z) is increased. Thus, it is preferable to change the moving-down amount of the mechanical probe 3. When the increasing amount of the evaluation value J(z) is relatively small, the distance between the mechanical probe 3 and the sample 5 to be processed is relatively large, and therefore, the moving-down amount of the mechanical probe 3 is set to be relatively large. When the increasing amount of the evaluation value J(z) is relatively large, the distance between the mechanical probe 3 and the sample 5 to be processed is relatively small, and therefore, the moving-down amount of the mechanical probe 3 is set to be relatively small.

In this example, the case where the moving-down amount of the mechanical probe 3 is controlled using the relationship shown in FIG. 5 has been described. However, according to this invention, the distance between the mechanical probe 3 and the sample 5 to be processed can be measured using the relationship shown in FIG. 5. It is assumed that the relationship shown in FIG. 5 is previously obtained. When the evaluation value J(z) is calculated, the distance between the mechanical probe 3 and the sample 5 to be processed corresponding to the evaluation value J(z) can be read from a curve shown in FIG. 5.

Thus, according to this invention, the relationship shown in FIG. 5 is previously stored in a memory, whereby a device for measuring the distance between a probe and a sample can be constituted. According to this constitution, a measurement device for measuring the distance between the mechanical probe 3 and the sample 5 to be processed is not required to be provided, and an inexpensive device can be provided.

Figure 6:
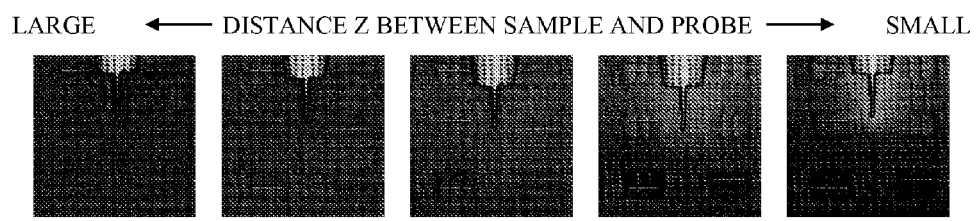
FIG. 6 is a view showing that brightness around the mechanical probe is changed by the change of the distance between the mechanical probe and the sample to be processed.
Figure 7:
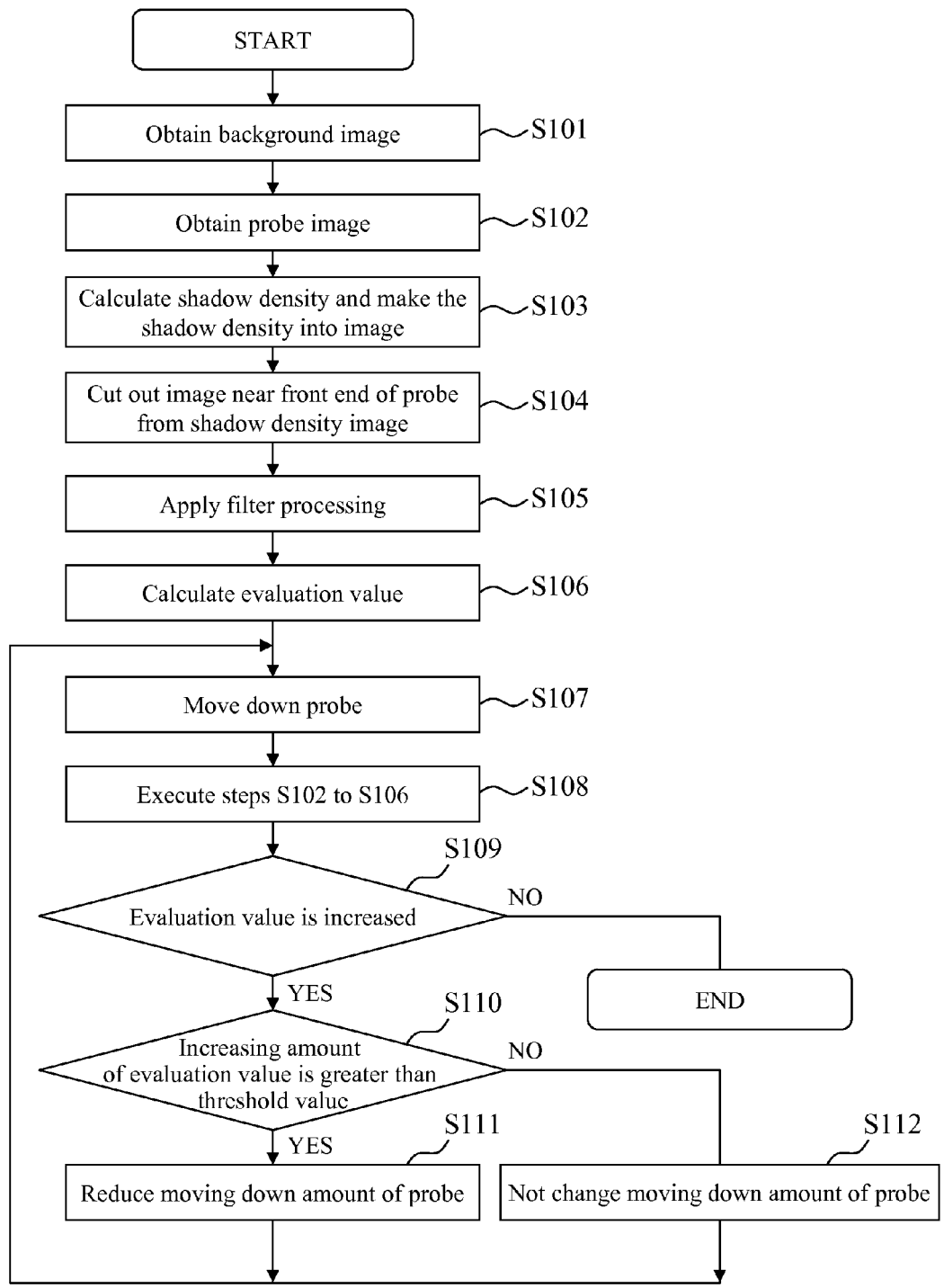
FIG. 7 is a view for explaining an example of a method of detecting a contact of the mechanical probe by the contact detecting device according to this invention and a view showing an embodiment in which the shadow density is obtained from a background image and a probe image.

FIG. 6 shows that an image around the mechanical probe, especially brightness thereof is changed due to the change of the distance between the mechanical probe 3 and the sample 5 to be processed. An image at the left end of FIG. 6 shows the case where the distance between the mechanical probe 3 and the sample 5 to be processed is relatively large, and an image at the right end of FIG. 6 shows the case where the distance between the mechanical probe 3 and the sample 5 to be processed is relatively small. As illustrated, when the distance between the mechanical probe 3 and the sample 5 to be processed is relatively small, it is found that the brightness around the mechanical probe is significantly changed. Accordingly, the change of the shadow of the mechanical probe 3 is detected, that is, the change of the brightness around the mechanical probe is detected, whereby the distance between the mechanical probe 3 and the sample 5 to be processed can be indirectly known. Although described in detail hereinafter, according to this invention, the change of the shadow of the mechanical probe 3, that is, the change of the brightness is quantitatively calculated, whereby the distance between the mechanical probe 3 and the sample 5 to be processed is detected, that is, it is detected that the mechanical probe 3 is in contact with the sample 5 to be processed. Hereinafter, although the case where the mechanical probe 3 is in contact with the sample 5 to be processed will be described, as shown in FIG. 1, the same holds for the case where the mechanical probe 3 is in contact with the conveying holder 4.

Figure 8A:
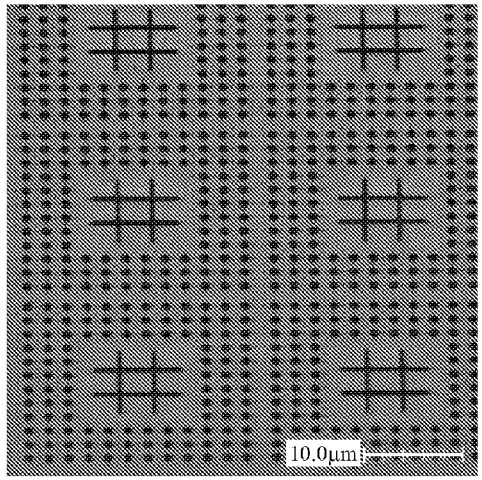
FIG. 8A, FIG. 8B, FIG. 8C, and FIG. 8D are views showing examples of a reference image, the probe image, a shadow density image, and a cut-out image from the shadow density image obtained by the contact detecting device according to this invention.

An example of a method of detecting the contact of the mechanical probe by the contact detecting device according to this invention will be described with reference to FIGS. 7, 8A, 8B, 8C, 8D, 9A and 9B. First, the mechanical probe is at a standby position. In step S101, the background image brightness $I_0(x, y)$ is obtained. Namely, an image of a surface of a sample not including the mechanical probe is obtained. FIG. 8A shows an example of the background image $I_0(x, y)$.

Figure 8C:
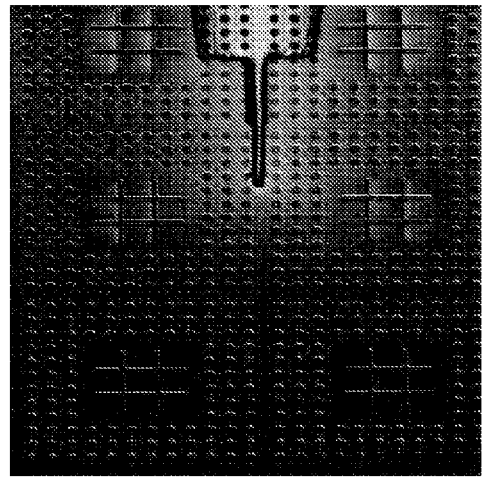
Figure 8B:
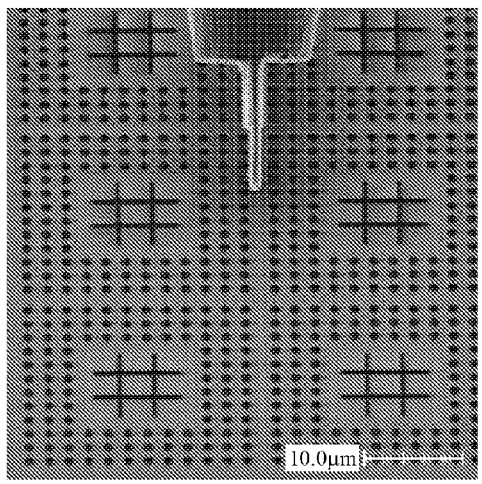

In step S102, an image including the mechanical probe 3 is obtained. Namely, an image of the front end of the mechanical probe 3 is obtained. FIG. 8B shows an example of the probe image $I_z(x, y)$. As illustrated, the brightness is reduced around the mechanical probe. The background image $I_0(x, y)$ and the probe image $I_z(x, y)$ show the brightness at the pixel position (x, y). The background image $I_0(x, y)$ may be stored in the first image memory 14 of the contact detecting device of the mechanical probe shown in FIG. 3, and the probe image $I_z(x, y)$ may be stored in the second image memory 15 of the contact detecting device of the mechanical probe shown in FIG. 3.

In step S103, the shadow density is calculated as the feature quantity of the shadow. The shadow density is calculated by the formula (1). The formulae other than the formula (1) may be used as described above. FIG. 8C shows an image made from the shadow density S(x, y). As illustrated, a deep or thick shadow portion, that is, a region where the brightness reduction is large is indicated with a white color, and a thin or light shadow portion, that is, a region where the brightness reduction is small is indicated with a black color. In this example, the shadow density is normalized so that the numerical value of the thickest shadow portion is 1.0, and the numerical value of the thinnest shadow portion is 0.0. The shadow density may be calculated by the first calculator 17 of the contact detecting device of the mechanical probe shown in FIG. 3.

In step S104, a region near the front end of the mechanical probe 3 is cut out from the image of the shadow density shown in FIG. 8C. In order to detect that the mechanical probe 3 is in contact with the sample 5 to be processed, only the shadow density near the front end of the mechanical probe 3 may be paid attention to. When an observation magnification is high, and the rate of the region near the front end of the mechanical probe 3 occupying the image of the shadow density is high, the cut-out processing in step S104 may be omitted. Any pixel position (x1, y1) other than the region near the front end of the mechanical probe 3 may be paid attention to.

Figure 8D:
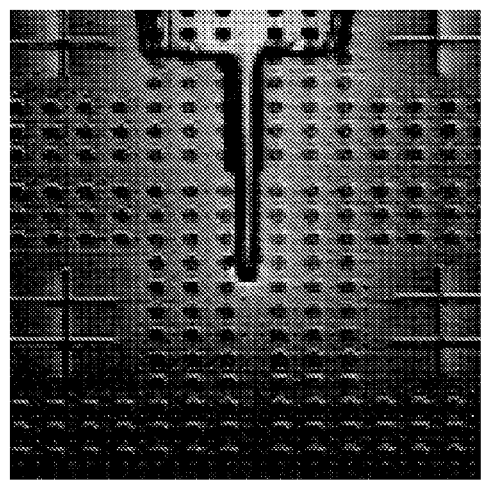

FIG. 8D shows an image obtained by cutting out the region near the front end of the mechanical probe 3 from the image of the shadow density shown in FIG. 8C. In the image shown in FIG. 8D, the value of the shadow density S(x, y) is large (close to the numerical value 1.0) in a thick shadow region, that is, near the front end of the mechanical probe 3. It is characterized in that the further from the front end, the smaller the value of the shadow density S(x, y) (close to the numerical value 0.0).

In step S105, a filter processing is applied to the image of FIG. 8D. In the cut-out image shown in FIG. 8D, the filter processing is performed to clarify the feature of the image near the front end of the mechanical probe 3. In this example, although the Gaussian filter shown in the formula (11) is used, other filter may be used, or the filter processing in step S105 may be omitted.

Figure 9A:
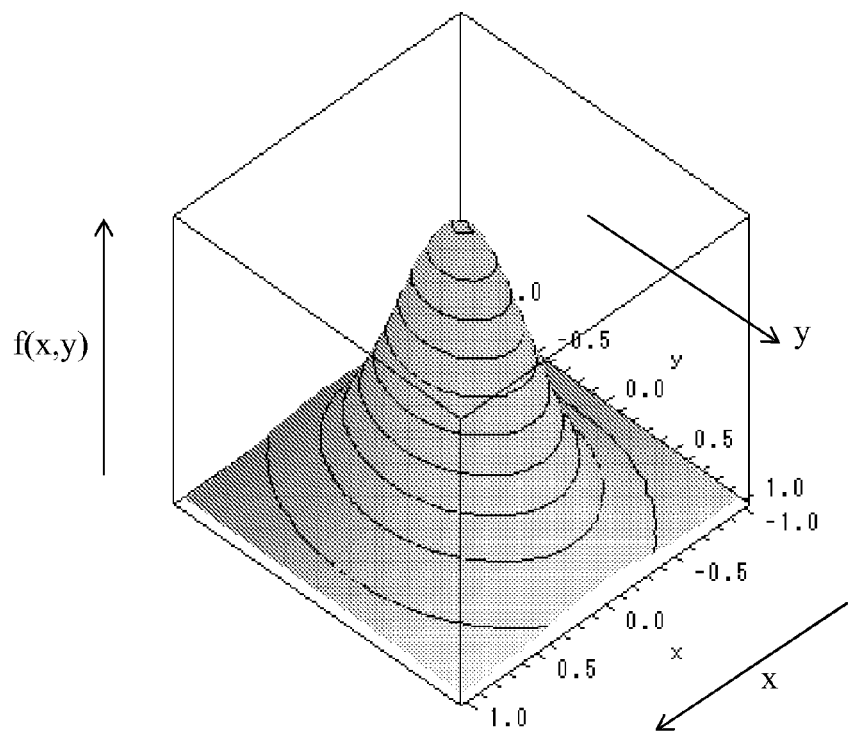
FIG. 9A and FIG. 9B are views showing characteristics of a Gaussian filter.
Figure 9B:
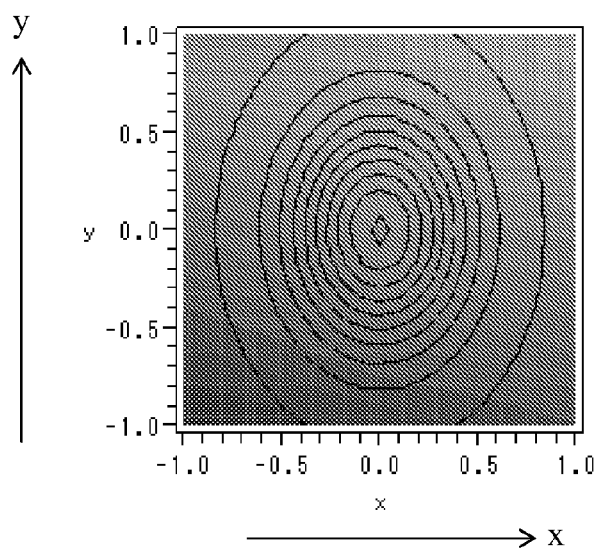

FIG. 9A is an overhead view showing the characteristics of the Gaussian filter of the formula (11). FIG. 9B is a contour diagram showing the characteristics of the Gaussian filter of the formula (11). The shape of the shadow according to the mechanical probe 3 is an elliptical shape determined by the incidence angle of the focused ion beam applied to the sample 5 to be processed and the mounting angle of the mechanical probe 3. Accordingly, in this example, it is preferable to select $\sigma_x$ and $\sigma_y$ so that the filter characteristics exhibit an elliptical shape. Needles to say, it may be set to be $\sigma_x = \sigma_y$, so that the filter characteristics may be a circular shape. When $\mu_x$ and $\mu_y$ are set to be ones other than zero, the filter characteristics, the center of which is on the coordinate point away from the front end of the mechanical probe 3 by $\mu_x$ and $\mu_y$, can be provided.

Figure 10:
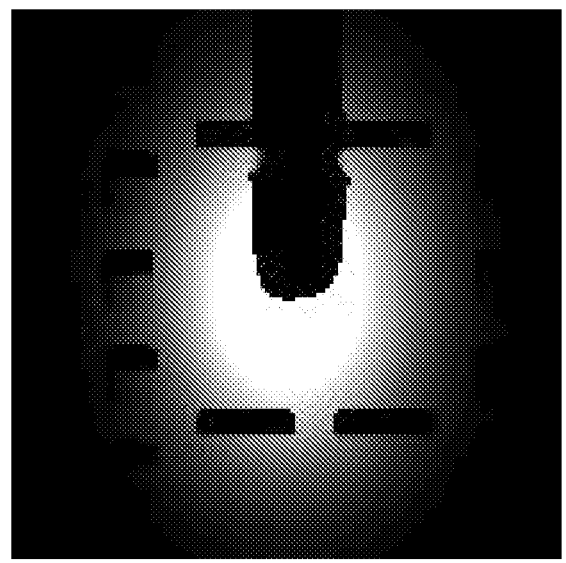
FIG. 10 is a view showing an example of an image obtained by applying the Gaussian filter to the shadow density image.

FIG. 10 shows a result obtained by applying the filter processing of the formula (11) to the image of the shadow density S(x, y) shown in FIG. 8D. In the image of FIG. 10, a white color is indicated in an elliptical region near the front end of the mechanical probe 3, and a black color is indicated outside the elliptical region far from the front end of the mechanical probe 3.

In step S106, the evaluation value J(z) is obtained by the image of the shadow density shown in FIG. 10 subjected to the filter processing. The evaluation value J(z) is obtained by the formula (10). As described above, the evaluation value J(z) represents the distance between the sample 5 to be processed and the mechanical probe 3. As shown in the formula (10), the evaluation value J(z) is obtained by multiplying the shadow density S(x, y) at the pixel position (x, y) by the Gaussian filter function f(x, y) and integrating in the x and y directions. The evaluation value J(z) may be obtained using the formula (12) instead of the formula (10). In the formula (12), the shadow density S(x, y) is simply integrated in the x and y directions without the multiplication by the Gaussian filter function f(x, y). The evaluation value J(z) may be calculated by the second calculator 18 of the contact detecting device of the mechanical probe shown in FIG. 3.

Next, in step S107, the mechanical probe 3 is moved down. Namely, the mechanical probe 3 is moved down by a predetermined stroke from an initial position. Next, in step S108, the steps S102 to S106 are executed. Thus, the evaluation value J(z) after moving down of the mechanical probe 3 is obtained. In step S109, the evaluation value J(z) obtained in step S106 and the evaluation value J(z) obtained in step S108 are compared with each other, and whether or not the evaluation value J(z) is increased is determined. When the evaluation value J(z) is increased, it is determined that the mechanical probe 3 is not yet in contact with the sample 5, and the processing proceeds to step S110. When the evaluation value J(z) is not increased, it is determined that the mechanical probe 3 is in contact with the sample, and the processing is terminated. A case where the evaluation value J(z) is not increased or reduced, that is, a case where the evaluation value J(z) is not changed is not described. In this case, although the processing may proceed to step S110, the processing may be terminated, supposing that the evaluation value J(z) is reduced.

In step S110, whether or not the increasing amount of the evaluation value J(z) is greater than a predetermined threshold value is determined. When the increasing amount of the evaluation value J(z) is greater than the predetermined threshold value, as described with reference to FIG. 5, it is determined that the mechanical probe 3 approaches the sample 5 to be processed. In this case, the processing proceeds to step S111, the moving-down amount of the mechanical probe 3 is reduced. When the increasing amount of the evaluation value J(z) is not greater than the predetermined threshold value, as described with reference to FIG. 5, it is determined that the mechanical probe 3 does not yet approach the sample 5 to be processed. In this case, the processing proceeds to step S112, and the moving-down amount of the mechanical probe 3 is not changed. When the moving-down amount of the mechanical probe 3 is determined thus, the processing then returns to step S107 to move down the mechanical probe 3. In step S108, the evaluation value J(z) is calculated again. Thus, the moving down of the mechanical probe 3 and the calculation of the evaluation value J(z) are repeated. In step S109, when the evaluation value J(z) stops increasing, the processing is terminated. The processing of moving down of the mechanical probe 3 is performed by the controller 19 of the contact detecting device of the mechanical probe shown in FIG. 3.

Although the examples of the present invention have been described, those skilled in the art will easily understand that the invention is not limited to the above examples, and various changes may be made therein within the scope of the invention described in the appended claims.

The invention claimed is:

1. A contact detecting device, comprising a mechanical probe movable for being in contact with an object to be contacted, a charged particle beam source which generates a charged particle beam to be applied to the object to be contacted, a detector for detecting secondary particles or back-scattered particles from the object to be contacted, a calculating device which calculates, from a detection signal from the detector, a feature quantity of a shadow of the mechanical probe projected on the object to be contacted, and a control device which controls the operation of the mechanical probe, wherein:

the calculating device calculates a shadow density S(x, y) as the feature quantity of the shadow of the mechanical probe, the shadow density S(x, y) representing a deviation of brightness $I_z(x, y)$ at a pixel position (x, y) of an observed image when the mechanical probe is provided with respect to brightness $I_0(x, y)$ at the pixel position (x, y) of the observed image when the mechanical probe is not provided, and obtains an evaluation value J(z) based on the shadow density S(x, y), the evaluation value J(z) representing a distance between the object to be contacted and the mechanical probe.

2. The contact detecting device according to claim 1, wherein the evaluation value J(z) is obtained by integrating the shadow density S(x, y) in x and y directions.

3. The contact detecting device according to claim 1, further comprising a memory which stores a relationship between a distance between the object to be contacted and the mechanical probe and the evaluation value J(z);
wherein the calculating device obtains the distance between the object to be contacted and the mechanical probe from the relationship stored in the memory.

4. The contact detecting device according to claim 1, wherein the control device repeatedly moves down the mechanical probe with a predetermined moving-down amount, the calculating device calculates the evaluation value each time the mechanical probe is moved down, and when the evaluation value is not increased or reduced in comparison with the evaluation value at the previous moving down, the calculating device determines that the mechanical probe is in contact with the object to be contacted.

5. The contact detecting device according to claim 1, wherein the control device repeatedly moves down the mechanical probe with a predetermined moving-down amount, the calculating device calculates the evaluation value each time the mechanical probe is moved down, and when the increasing amount of the evaluation value is increased in comparison with the increasing amount of the evaluation value at the previous moving down, the calculating device determines that the mechanical probe approaches the object to be contacted.

6. The contact detecting device according to claim 5, wherein when the calculating device determines that the mechanical probe approaches the object to be contacted, the control device reduces the moving-down amount of the mechanical probe.

7. The contact detecting device according to claim 1, wherein the calculating device obtains the evaluation value J(z) using an image obtained by cutting out a region near a front end of the mechanical probe from an image of the shadow density S(x, y).

8. The contact detecting device according to claim 1, wherein in order to clarify the feature of the image near the front end of the mechanical probe in the image of the shadow density S(x, y), the calculating device performs a filter processing and obtains the evaluation value J(z) after the filter processing.

9. The contact detecting device according to claim 1, wherein the object to be contacted is a sample or a conveying holder holding a sample to be observed by an electron microscope.

10. A charged particle beam system, comprising a charged particle beam source generating a charged particle beam, a sample table supporting a sample, a mechanical probe used in an operation of cutting out a minute sample piece from the sample, a gas assisted gun used in a deposition operation, a detector which is used for detecting secondary particles or backscattered particles from an object to be contacted with which the mechanical probe is in contact, a calculating device which calculates, from a detection signal from the detector, a feature quantity of a shadow of the mechanical probe projected on the object to be contacted, and a control device controlling the operation of the mechanical probe;
wherein the calculating device calculates a shadow density S(x, y) as the feature quantity of the shadow of the mechanical probe, the shadow density S(x, y) representing a deviation of brightness $I_z(x, y)$ at a pixel position (x, y) of an observed image when the mechanical probe is provided with respect to brightness $I_0(x, y)$ at the pixel position (x, y) of the observed image when the mechanical probe is not provided, and obtains an evaluation value J(z) based on the shadow density S(x, y), the evaluation value J(z) representing a distance between the object to be contacted and the mechanical probe.

11. The charged particle beam system according to claim 10, wherein the evaluation value J(z) is obtained by integrating the shadow density S(x, y) in x and y directions.

12. The charged particle beam system according to claim 10, wherein the control device repeatedly moves down the mechanical probe with a predetermined moving-down amount, the calculating device calculates the evaluation value each time the mechanical probe is moved down, and when the evaluation value is not increased or reduced in comparison with the evaluation value at the previous moving down, the calculating device determines that the mechanical probe is in contact with the object to be contacted.

13. The charged particle beam system according to claim 10, wherein the control device repeatedly moves down the mechanical probe with a predetermined moving-down amount, the calculating device calculates the evaluation value each time the mechanical probe is moved down, and when the increasing amount of the evaluation value is increased in comparison with the increasing amount of the evaluation value at the previous moving down, the calculating device determines that the mechanical probe approaches the object to be contacted.

14. The charged particle beam system according to claim 13, wherein when the calculating device determines that the mechanical probe approaches the object to be contacted, the control device reduces the moving-down amount of the mechanical probe.

15. The charged particle beam system according to claim 10, further comprising a memory which stores a relationship between a distance between the object to be contacted and the mechanical probe and the evaluation value J(z);
wherein the calculating device obtains the distance between the object to be contacted and the mechanical probe from the relationship stored in the memory.

16. The charged particle beam system according to claim 10, wherein the object to be contacted is a sample or a conveying holder holding a sample to be observed by an electron microscope.

17. A contact detecting method of detecting a contact between an object to be contacted and a mechanical probe, comprising the steps of:
moving the mechanical probe toward the object to be contacted;
applying a charged particle beam to the object to be contacted;
detecting secondary particles or backscattered particles from the object to be contacted;
calculating a shadow density S(x, y) from a detection signal of the secondary particles or the backscattered particles, the shadow density S(x, y) representing a deviation of brightness $I_z(x, y)$ at a pixel position (x, y) of an observed image when the mechanical probe is provided with respect to brightness $I_0(x, y)$ at the pixel position (x, y) of the observed image when the mechanical probe is not provided;
obtaining an evaluation value J(z) based on the shadow density S(x, y), the evaluation value J(z) representing a distance between the object to be contacted and the mechanical probe; and
detecting the contact of the mechanical probe to the object to be contacted by the evaluation value J(z).

18. The contact detecting method according to claim 17, wherein the evaluation value J(z) is obtained by integrating the shadow density S(x, y) in x and y directions.

19. The contact detecting method according to claim 17, wherein the mechanical probe is repeatedly moved down with a predetermined moving-down amount, the evaluation value is calculated each time the mechanical probe is moved down, and when the evaluation value is not increased or reduced in comparison with the evaluation value at the previous moving down, it is determined that the mechanical probe is in contact with the object to be contacted.

20. The contact detecting method according to claim 17, wherein the mechanical probe is repeatedly moved down with a predetermined moving-down amount, the evaluation value is calculated each time the mechanical probe is moved down, and when the increasing amount of the evaluation value is increased in comparison with the increasing amount of the evaluation value at the previous moving down, it is determined that the mechanical probe approaches the object to be contacted.

* * * * *